(12) United States Patent
Sajiki

(10) Patent No.: US 9,728,688 B2
(45) Date of Patent: Aug. 8, 2017

(54) METHOD OF MANUFACTURING LIGHT EMITTING DEVICE INCLUDING LIGHT EMITTING ELEMENT HAVING LATERAL SURFACE COVERED WITH COVER MEMBER

(71) Applicant: NICHIA CORPORATION, Anan-shi (JP)

(72) Inventor: Shigeki Sajiki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/197,761

(22) Filed: Jun. 30, 2016

(65) Prior Publication Data

US 2017/0005243 A1    Jan. 5, 2017

(30) Foreign Application Priority Data

Jun. 30, 2015  (JP) .................................. 2015-131581

(51) Int. Cl.
*H01L 33/54* (2010.01)
*H01L 33/50* (2010.01)

(52) U.S. Cl.
CPC ............. *H01L 33/54* (2013.01); *H01L 33/50* (2013.01); *H01L 2933/0016* (2013.01); *H01L 2933/0041* (2013.01)

(58) Field of Classification Search
None
See application file for complete search history.

(56) References Cited

U.S. PATENT DOCUMENTS

| 6,420,201 B1 * | 7/2002 | Webster ................ G01L 9/0054 |
| | | 257/E21.504 |
| 7,273,767 B2 * | 9/2007 | Ong ...................... G01L 19/141 |
| | | 257/E23.046 |
| 7,727,819 B2 * | 6/2010 | Yoneda ............... H01L 23/3185 |
| | | 257/787 |

(Continued)

FOREIGN PATENT DOCUMENTS

| JP | 2009-99680 | 5/2009 |
| JP | 2010-219324 | 9/2010 |

(Continued)

*Primary Examiner* — Andres Munoz
(74) *Attorney, Agent, or Firm* — Mori & Ward, LLP

(57) ABSTRACT

A method of manufacturing a light emitting device includes providing a light emitting element, a light extracting surface, and a light emitting element lateral surface. A lower mold has an upper surface and a projected portion. The projected portion has a bottom portion. The projected portion has a projected portion upper surface. The projected portion has a projected portion lateral surface provided between the bottom portion and the projected portion upper surface. The light emitting element is arranged on the projected portion such that the light extracting surface contacts the projected portion upper surface. The projected portion lateral surface and the light emitting element lateral surface are covered with a cover member. The lower mold is removed to provide a recessed portion on the light extracting surface surrounded by a sidewall made of the cover member. A first light-transmissive member is provided in the recessed portion.

8 Claims, 12 Drawing Sheets

(56) References Cited

U.S. PATENT DOCUMENTS

| | | | |
|---|---|---|---|
| 7,998,781 B2 * | 8/2011 | Uchida | H01L 27/14683 438/116 |
| 8,937,328 B2 * | 1/2015 | Mitsuishi | C09K 11/0883 257/100 |
| 9,470,652 B1 * | 10/2016 | Hooper | G01N 27/4148 |
| 2005/0156189 A1 * | 7/2005 | Deguchi | H01L 33/42 257/103 |
| 2009/0057701 A1 * | 3/2009 | Chao | H01L 33/44 257/98 |
| 2009/0086449 A1 * | 4/2009 | Minamio | H01L 27/14618 361/760 |
| 2009/0097139 A1 | 4/2009 | Minamio et al. | |
| 2010/0320479 A1 * | 12/2010 | Minato | H01L 33/56 257/88 |
| 2012/0261699 A1 | 10/2012 | Ooyabu et al. | |
| 2014/0138725 A1 | 5/2014 | Oyamada | |

FOREIGN PATENT DOCUMENTS

| | | |
|---|---|---|
| JP | 2012-222315 | 11/2012 |
| JP | 2012-227470 | 11/2012 |
| JP | 2013-12545 | 1/2013 |
| JP | 2014-112669 | 6/2014 |

\* cited by examiner

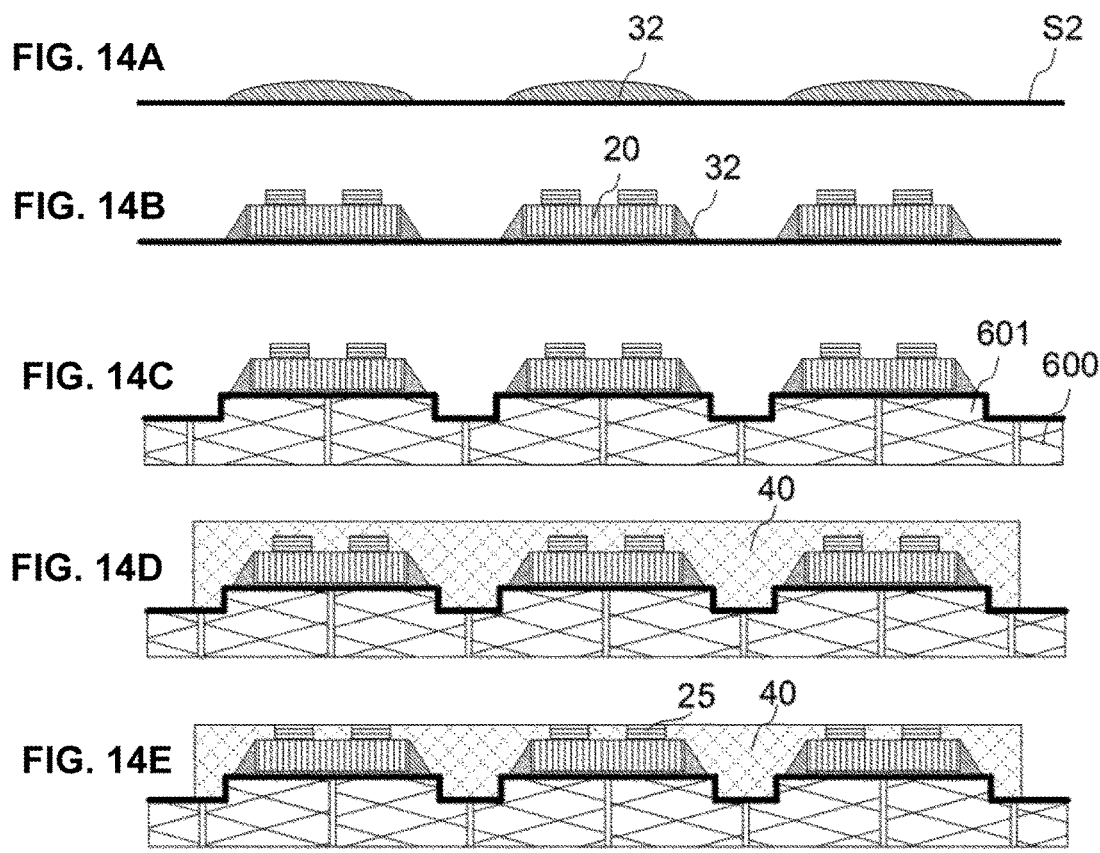

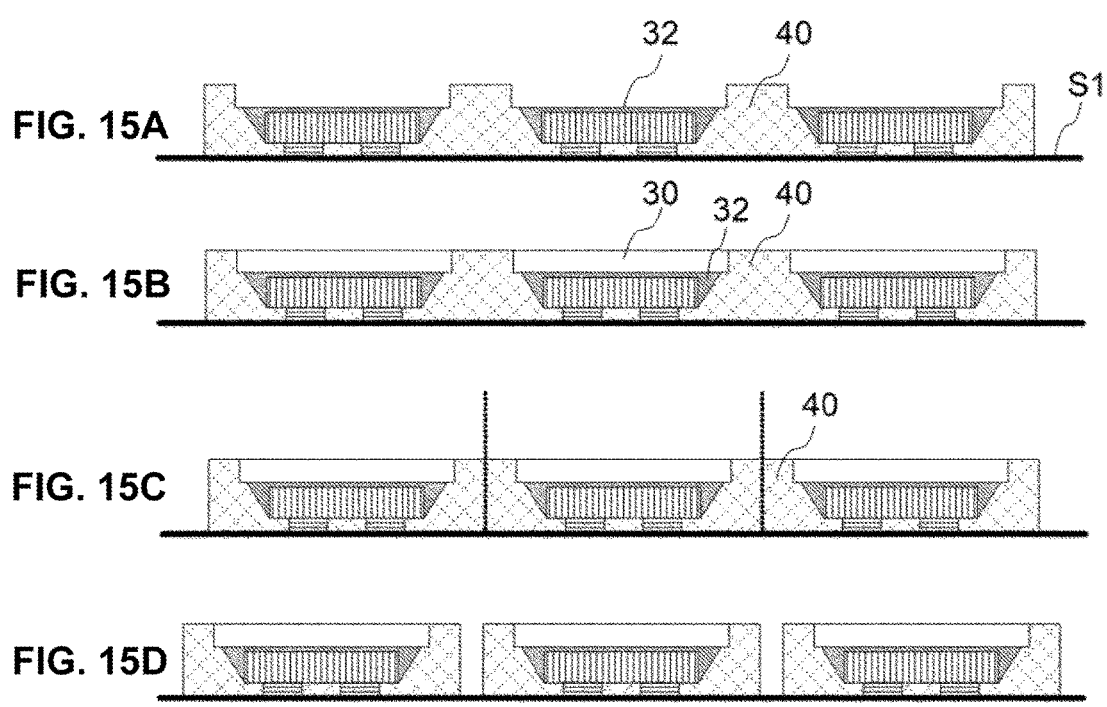

METHOD OF MANUFACTURING LIGHT EMITTING DEVICE INCLUDING LIGHT EMITTING ELEMENT HAVING LATERAL SURFACE COVERED WITH COVER MEMBER

CROSS-REFERENCE TO RELATED APPLICATIONS

The present application claims priority under 35 U. S. C. §119 to Japanese Patent Application No. 2015-131581, filed Jun. 30, 2015. The contents of this application are incorporated herein by reference in their entirety.

BACKGROUND

Technical Field

The present disclosure relates to a method of manufacturing a light emitting device.

Discussion of the Background

There are known light emitting devices in which, in place of provision of a housing for containing a light emitting element, the lateral surface of the light emitting element is covered by a reflective member (e.g., Japanese Unexamined Patent Application Publication No. 2010-219324, 2012-227470, 2013-012545, 2014-112669).

SUMMARY OF THE INVENTION

According to one aspect of the present invention, a method of manufacturing a light emitting device includes providing a light emitting element that has an electrode-formed surface, a light extracting surface opposite to the electrode-formed surface in a light emitting element height direction, and a light emitting element lateral surface provided between the electrode-formed surface and the light extracting surface. A lower mold is provided. The lower mold has an upper surface and a projected portion projecting in a mold height direction from the upper surface. The projected portion has a bottom portion which is provided on the upper surface. The projected portion has a projected portion upper surface opposite to the bottom portion in the mold height direction. The projected portion has a projected portion lateral surface provided between the bottom portion and the projected portion upper surface. The light emitting element is arranged on the projected portion of the lower mold such that the light extracting surface contacts the projected portion upper surface. The projected portion lateral surface and the light emitting element lateral surface are covered with a cover member. The lower mold is removed to provide a recessed portion on the light extracting surface surrounded by a sidewall made of the cover member. A first light-transmissive member is provided in the recessed portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIGS. 14A to 14E are schematic diagrams showing a method of manufacturing the light emitting device according to the third embodiment.

FIGS. 15A to 15D are schematic diagrams showing the method of manufacturing the light emitting device according to the third embodiment.

DETAILED DESCRIPTION OF EMBODIMENTS

Figure 1A:
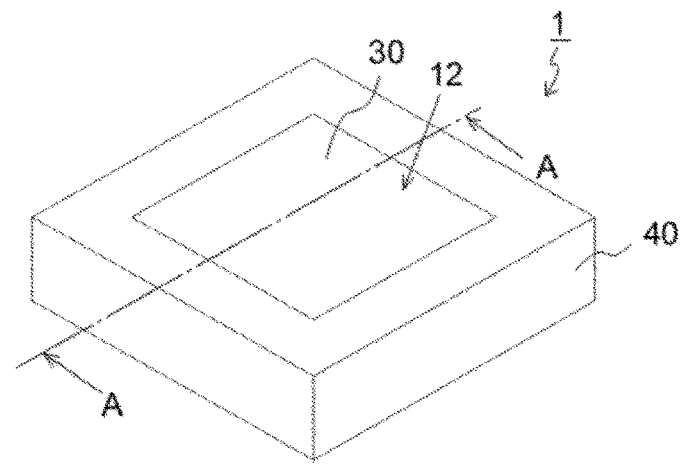
FIG. 1A is a perspective view schematically showing an exemplary light emitting device according to a first embodiment.

The embodiments will now be described with reference to the accompanying drawings, wherein like reference numerals designate corresponding or identical elements throughout the various drawings.

In the following, a detailed description will be given of embodiments of the present invention with reference to the drawings. In the following description, terms representing specific directions or positions (for example, "upper", "lower", "right", "left" and other terms including those terms) are used as necessary. These terms are used for facilitating understanding of the embodiments of the invention with reference to the drawings, and the technical scope of the present invention is not limited by the meaning of the terms. Further, like reference numerals appearing in a plurality of drawings denote like portions or members.

First Embodiment

Figure 1B:
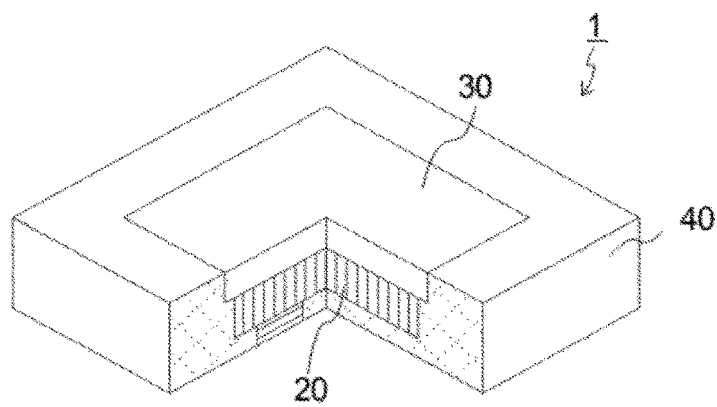
FIG. 1B is a partial cutaway view schematically showing the light emitting device according to the first embodiment.
Figure 1C:
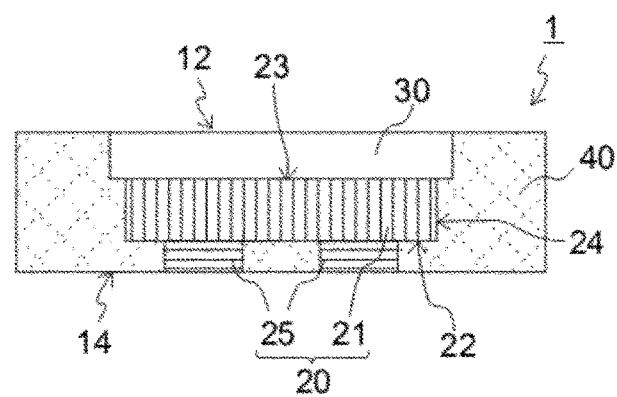
FIG. 1C is a cross-sectional view taken along line A-A in FIG. 1A.

FIGS. 1A to 1C show a light emitting device 1 according to a first embodiment. The light emitting device 1 includes a light emitting element 20, a first light-transmissive member 30 provided at an upper surface of the light emitting element 20, and a cover member 40 that covers a lateral surface of the first light-transmissive member 30. The upper surface of the first light-transmissive member 30 functions as a light emitting surface (i.e., light extracting surface) 12 of the light emitting device 1.

With reference to FIGS. 2A to 4, a description will be given of a method of manufacturing the light emitting device according to the first embodiment.

(Preparation of Light Emitting Element)

As the light emitting element 20, for example, a semiconductor light emitting element such as a light emitting diode is prepared. The light emitting element 20 includes a stacked-layer structure body 21, which is made of a light-transmissive substrate and a semiconductor layer, and electrodes 25. The surface that is opposite to the surface where the electrodes 25 are provided (i.e., the electrode-formed surface), that is, the surface of the light-transmissive substrate (i.e., the surface where the semiconductor layer is not formed) is used as a light extracting surface 23.

(Preparation of Mold)

Figure 2A:
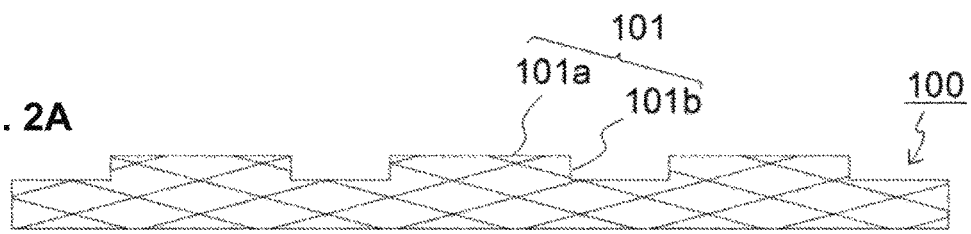
FIGS. 2A to 2D are schematic diagrams showing a method of manufacturing the light emitting device according to the first embodiment.

For example, as shown in FIG. 2A, a mold (lower mold) 100 having a plurality of projected portions 101 at its upper surface is prepared. The projected portions 101 each have an upper surface 101a for the light emitting element to be arranged thereon. The upper surface 101a of each projected portion preferably has a flat surface so as to conform to the lower surface (i.e., a light extracting surface, which will be described later) of the light emitting element. The projected portions of the mold each correspond to a recessed portion where the first light-transmissive member is disposed after the mold is removed in a subsequent process.

For example, in the case where one light emitting element is arranged on one projected portion, the upper surface 101a of the projected portion preferably has an area of at least 50% to 200%, further preferably 100% to 120%, as great as the area of the light extracting surface of the light emitting element. The plurality of projected portions provided to one mold are preferably all identical to each other in the shape. The projected portions are preferably arranged such that a distance between adjacent ones of the projected portions is constant. More preferably, the projected portions are regularly arranged in the longitudinal and lateral directions, in other words, arranged in a matrix.

The shape of the upper surface 101a of each projected portion of the mold may be circular, elliptical, polygonal (for example, quadrangular, hexagonal), or a combination thereof. The lateral surface 101b of the projected portion may be perpendicular or inclined relative to the upper surface 101a of the projected portion. That is, when the lateral surface 101b of the projected portion is perpendicular, the shape of the projected portion 101 may be columnar such as circular cylindrical, prismatic (for example, a quadrangular prism, a hexagonal prism). When the lateral surface 101b is an inclined surface, the shape of the projected portion may be a frustum such as a truncated cone, a truncated pyramid and the like. In the case where the lateral surface 101b of the projected portion is inclined, the inclination angle may be about 30 degrees to 90 degrees relative to the upper surface (i.e., the horizontal plane). Further, the height of the projected portion 101 is, for example, preferably about 0.1 mm to 0.5 mm and further preferably about 0.15 mm to 0.25 mm.

The surface between the projected portions of the mold (i.e., the upper surface) is preferably a flat surface. The surface between the projected portions of the mold is a surface, which forms the upper surface of a sidewall that surrounds the first light-transmissive member and serves as the light emitting surface of the light emitting device. Therefore, it is preferably a flat surface, but is not limited thereto, and a minor recessed portion or a projected portion may exist on the surface between the projected portions of the mold.

Figure 9A:
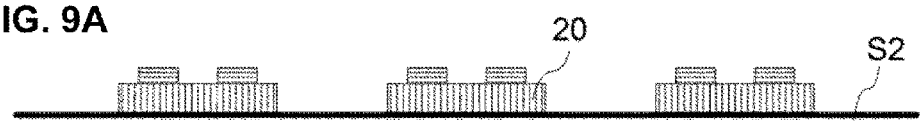
FIGS. 9A and 9B are schematic diagrams for showing the method of manufacturing the light emitting device according to the first embodiment.
Figure 9B:
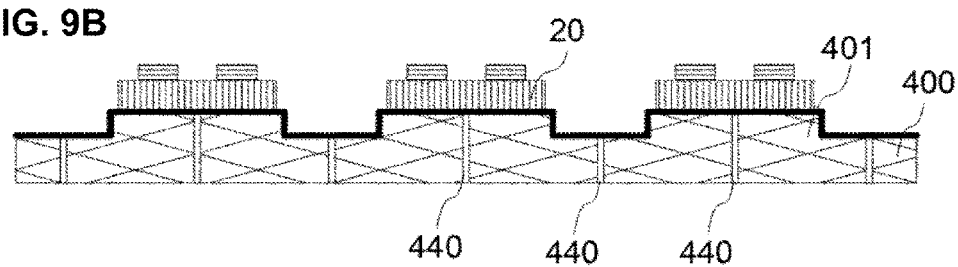

The mold may have a through hole at the upper surface of each projected portion, or at the surface between the projected portions (for example, through holes 440 shown in FIG. 9B). The through holes are provided for vacuum suctioning, and capable of, for example, holding a sheet or the light emitting elements by suction. In the case where the projected portions are provided at the upper surface of a lower mold 400 and the light emitting elements are arranged thereon together with the sheet, the positions of the projected portions are difficult to be visually recognized. Therefore, by the sheet held by suction so as to conform to the shape of the projected portions, the positions where the light emitting elements are to be respectively arranged, that is, the upper surfaces of the projected portions) can be visually recognized easier. Further, by the sheet being held by suction so as to conform to the shape of the upper surface of the mold, the cover member can be formed to have a shape that is similar to the shape of the upper surface of the mold. For example, when the sheet is held by suction at the mold and thereby previously deformed so as to conform to the projected portions, the cover member of a regular shape can be formed. Further, the sheet may be deformed by pressure so as to conform to the projected portions of the mold when the cover member is formed.

The mold may be solely the lower mold having the projected portions at its upper surface as described above. Alternatively, the mold may have an upper mold. When the mold constitutes solely the lower mold, formation of the cover member, which will be described later, may be carried out by potting, printing, spraying and the like. When the lower mold and the upper mold are used, the formation of the cover member described later may be carried out by transfer molding, compression molding, injection molding and the like. When the upper mold is used, the lower surface of the upper mold and the upper surface of the lower mold are disposed so as to oppose to each other. The lower surface of the upper mold may be a flat surface, or may have minor unevenness. Further, preferably, the lower surface of the upper mold and the upper surfaces of the projected portions of the lower mold are disposed with a clearance for the material of the cover member to be poured, that is, they are disposed as being spaced apart from each other.

(Fixation of Light Emitting Element)

Figure 2B:
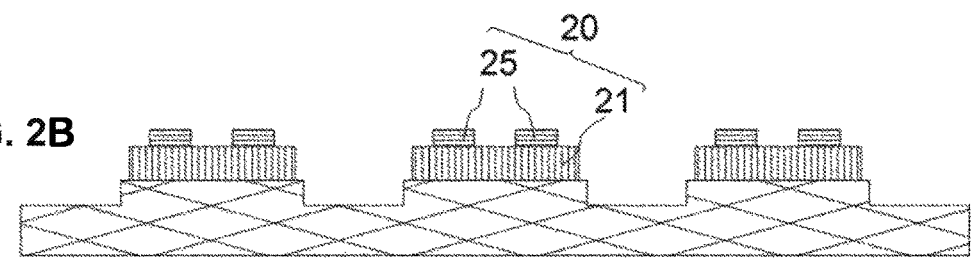

As shown in FIG. 2B, the light emitting element 20 is disposed at the upper surface 101a of each projected portion of the lower mold 100. At this time, for example, the light extracting surface of the light emitting element 20 is opposed to the upper surface 101a of the projected portion. In other words, the light emitting element 20 is disposed with the electrode-formed surface (the surface where the electrodes 25 are formed) facing up, and the stacked-layer structure body 21 facing down. The light emitting element 20 may be fixed by an adhesive agent, or by vacuum suction. In the case where an adhesive agent is used, the adhesive agent may be applied on the upper surface 101a of the projected portion, or may be applied on the light extracting surface of the light emitting element. In the case where the vacuum suction is used, the upper surface of the projected portion of the lower mold may be previously provided with a through hole for vacuum suctioning, and the light emitting element arranged thereon may be vacuumed (suctioned). In this case, the opening diameter of the through hole is preferably greater than the area of the light emitting element, that is, the area of the light extracting surface). The case where a sheet is used will be described later.

(Formation of Cover Member)

Figure 2C:
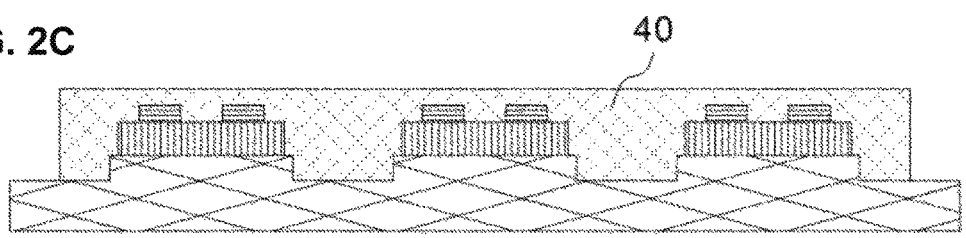
Figure 2D:
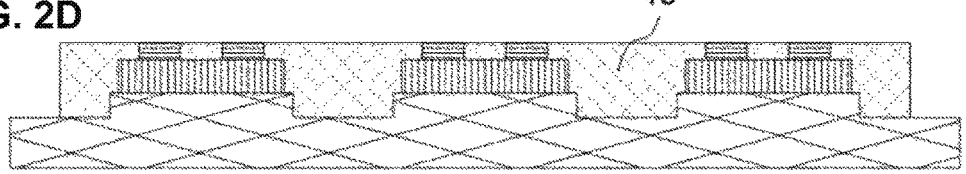

Subsequently, the cover member 40 is formed so as to cover the lateral surfaces 101b of each projected portion of the mold and the lateral surfaces of each light emitting element 20. Here, preferably, the cover member 40 is provided so as to cover the entire lateral surfaces of the light emitting element 20. The cover member 40 may be provided so as to further cover the electrode-formed surface of the light emitting element. For example, as shown in FIG. 2C, the cover member 40 may be provided such that the upper surfaces of the electrodes 25 are buried. In the case where the electrodes 25 are buried in this manner, as shown in FIG. 2D, a process of exposing the upper surfaces of the electrodes 25 is necessary.

The cover member 40 is formed as follows, for example. A frame that surrounds the light emitting element arranged on the upper surface of the projected portion of the lower mold is provided, and a liquid resin material being the raw material of the cover member is poured in the frame. The liquid resin material is cured by application of heat and the like. The frame and the lower mold are removed. Thus, the cover member can be formed.

Figure 3A:
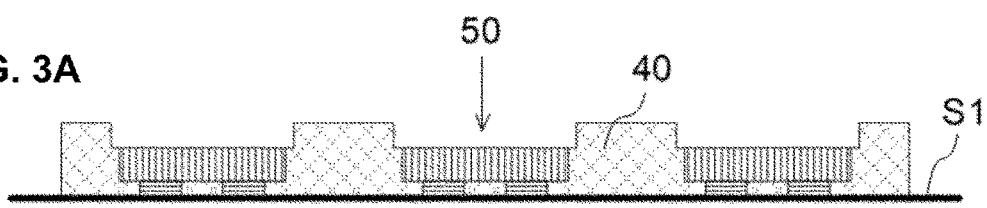
FIGS. 3A to 3D are schematic diagrams showing the method of manufacturing the light emitting device according to the first embodiment.
Figure 3B:
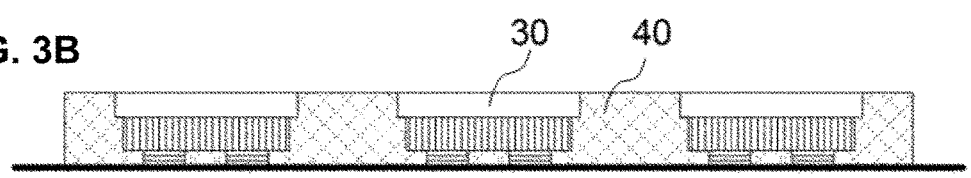
Figure 4:
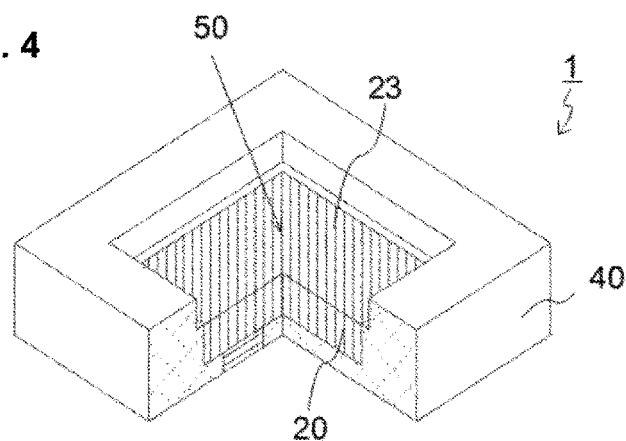
FIG. 4 is a schematic diagram in which part of the light emitting device according to the first embodiment is omitted.

FIG. 3A shows the state where the mold 100 is removed in the state where a sheet S1 is bonded to the electrode-formed surface side, and the molded workpiece is turned upside down. The cover member 40 formed according to the above-described method is structured to have recessed portions 50. FIG. 4 exemplarily shows the recessed portion 50 formed in this manner, and exemplarily shows one individual light emitting device. The bottom surface of the recessed portion 50 is the light extracting surface 23 of the light emitting element 20, and the sidewall thereof is the cover member 40. The bottom surface of the recessed portion 50 is structured by the light extracting surface of the light emitting element 20 and the cover member 40 provided around the light extracting surface. The upper surface of the projected portion of the mold corresponds to the bottom surface of the recessed portion of the light emitting device. The proportion, position, shape and the like of the cover member at the bottom surface of the recessed portion can be changed depending on the dimension of the light extracting surface of the light emitting element and that of the upper surface of the projected portion of the mold.

The cover member 40 can be formed by potting, spray coating, printing or other methods using solely the lower mold. Alternatively, the cover member 40 may be formed by compression molding, injection molding, transfer molding or other methods using also the upper mold. In the case where the cover member is formed so as to embed the electrodes of the light emitting element, the cover member must be removed (grinding, abrading, etching and the like) until the electrodes are exposed, after the formation of the cover member.

(Formation of First Light-Transmissive Member)

As described above, the cover member 40 formed with the mold having the projected portions is provided with the recessed portions 50 corresponding to the projected portions. Then, the recessed portions are each filled with the first light-transmissive member. The light-transmissive member can be provided through potting, spray coating, printing and the like. Particularly, potting is preferable. For example, in the example shown in FIG. 3B, the recessed portions 50 are each filled with the first light-transmissive member 30 having a height reaching the upper end of the cover member 40.

Figure 3C:
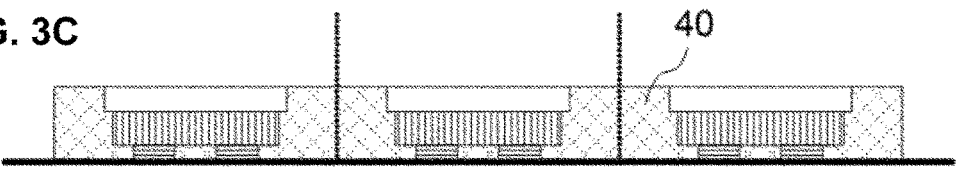
Figure 3D:
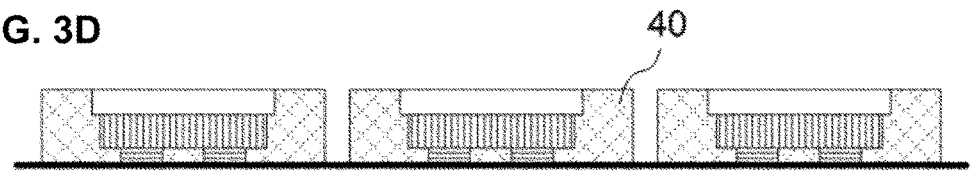

A group of light emitting devices obtained as described above is cut between the light emitting elements as shown in FIG. 3C. Thus, as shown in FIG. 3D, singulated light emitting devices can be obtained.

As another example, protrusions serving as partition s can be provided on the lower mold between each of the projected portions on which each of the light emitting elements are disposed in order to form the cover member 40 separately in the first place. In this case, the above mentioned process of cutting the cover member 40 is not needed.

The processes described above may include the following processes.

(Sheet)

In preparing the light emitting elements, a sheet may be used. For example, as shown in FIG. 9A, singulated light emitting elements 20 are disposed such that their respective light extracting surfaces oppose to the upper surface of a sheet S2. Thereafter, the light emitting elements 20 can be disposed together with the sheet S2 on the upper surface of the lower mold 400. Thus, as compared to the case where the light emitting elements are disposed one by one on the upper surface of the projected portions of the lower mold, the disposition can be performed quicker.

The sheet is preferably great enough to solely cover the entire upper surface of one lower mold. The sheet is preferably elastic so as to be capable of deforming conforming to the shape of the projected portions of the lower mold. For example, the sheet may be made of silicone, polyvinyl chloride, polyolefin, polyurethane, polyimide and the like. Though the thickness of the sheet is not particularly limited, it is preferably smaller than the height of the projected portions of the mold. The thickness is preferably smaller than the height of the light emitting elements. The thickness herein refers to that in the state where the sheet is not stretched. When the sheet is stretched conforming to the shape of the projected portions of the lower mold, the thickness is preferably about 0.06 mm. The upper surface of the sheet, in other words, the surface on which the light emitting elements are arranged) is preferably adhesive.

This sheet is still disposed on the upper surface of the lower mold as it is when the cover member is formed. Therefore, the cover member is not in direct contact with the upper surface of the lower mold. After the lower mold is removed or simultaneously when the lower mold is removed, the sheet is also removed. Thus, the cover member can be formed having the recessed portions on the light extracting surface side of the light emitting elements. The cover member formed in this manner using the sheet is provided with the recessed portions corresponding to the projected portions that are greater in size than the actual projected portions of the mold by the thickness of the sheet.

(Wavelength Conversion Member)

The first light-transmissive member may contain a light-transmissive material and a wavelength conversion member. In preparing the light-transmissive material, the wavelength conversion member is mixed with the light-transmissive material by a predetermined ratio. Thereafter, the recessed portion of the light emitting element may be filled with the mixture. In this manner, provision of the first light-transmissive member, which contains the wavelength conversion member, in the recessed portion can provide a light emitting device capable of emitting light of mixed color derived from the light emitting element and the wavelength conversion member.

One light emitting element may be arranged on the upper surface of one projected portion of the mold. Alternatively, a plurality of light emitting elements may be arranged on one projected portion.

Figure 5:
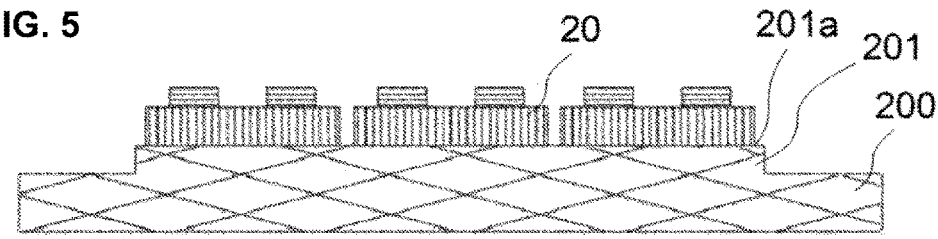
FIG. 5 is a schematic diagram showing the method of manufacturing the light emitting device according to the first embodiment.
Figure 6:
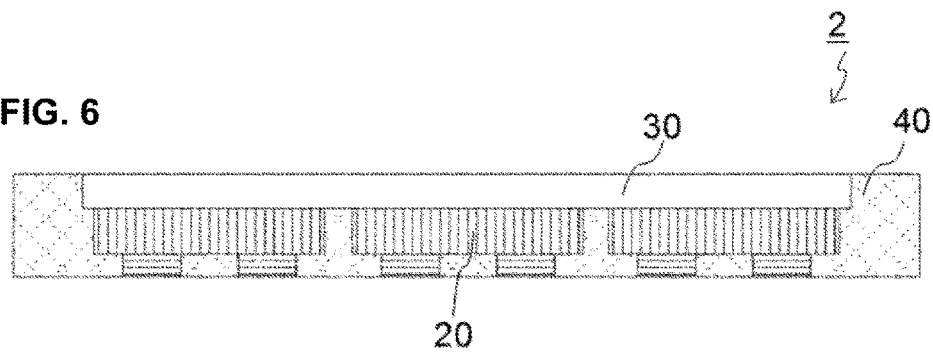
FIG. 6 is a schematic cross-sectional view showing an exemplary light emitting device according to the first embodiment.

For example, in the example shown in FIG. 5, three light emitting elements are disposed so as to be laterally juxtaposed to one another on an upper surface 201a of one projected portion 201 formed on the upper surface of a mold 200. Through use of such a mold, a light emitting device in which three light emitting elements are disposed in one recessed portion can be formed. For example, as shown in FIG. 6, the structure in which three light emitting elements are arranged in the region surrounded by the sidewall of one recessed portion structured by the cover member 40 can be obtained. Thus, one first light-transmissive member 30 can be integrally provided across the upper surfaces of a plurality of light emitting elements 20, and a light emitting device with clear outline of light emitting area that collectively emits light of a plurality of light emitting elements can be obtained. Further, as compared to the case where three light emitting devices each having one light emitting element are juxtaposed to one another, the light emitting device having the output of the three light emitting elements can be reduced in size. Further, since the three light emitting elements can be disposed more closely to one another, regions where the light emitting portions are divided can be reduced, whereby the light emitting device can be visually recognized so as to have an integral single light emitting surface.

Figure 7:
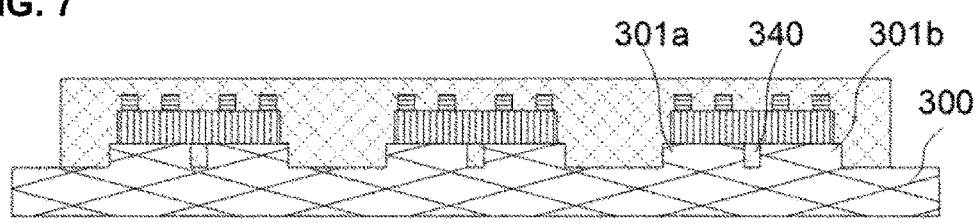
FIG. 7 is a schematic diagram for showing the method of manufacturing the light emitting device according to the first embodiment.
Figure 8:
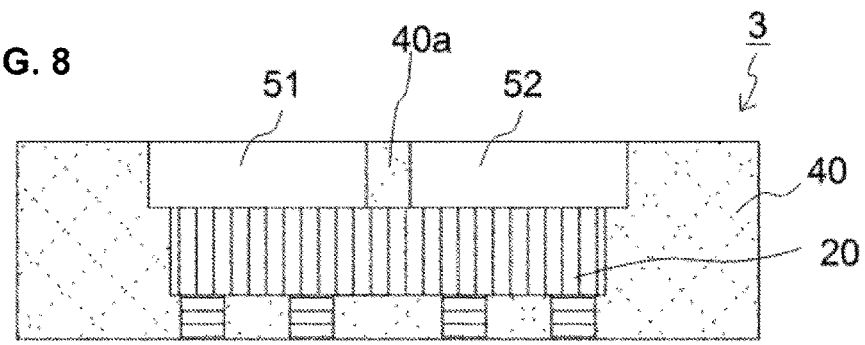
FIG. 8 is a schematic cross-sectional view showing an exemplary light emitting device according to the first embodiment.

Further, one light emitting element may be arranged on a plurality of projected portions. For example, in the example shown in FIG. 7, one light emitting element 20 is disposed on two projected portions 301a and 301b formed at the upper surface of a mold 300. Thus, for example a light emitting device 3 shown in FIG. 8 can be obtained. Since the cover member 40 is formed also at a groove portion 340 between the projected portion 301a and the projected portion 301b, on the light emitting surface side of the light emitting element 20, two recessed portions 51 and 52 are formed having a wall portion 40a interposed therebetween. While the two recessed portions 51 and 52 are respectively provided with the first light-transmissive members, they may be provided with an identical type of first light-transmissive members, or may be provided with different types of first light-transmissive members. Such a structure realizes a light emitting device that is small in size and capable of emitting simultaneously or alternatively light of different wavelengths.

Second Embodiment

Figure 10A:
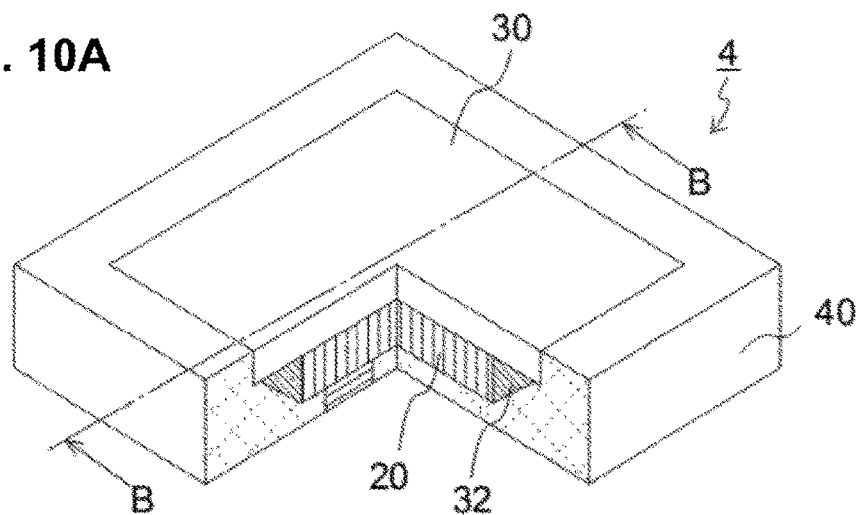
FIG. 10A is a perspective view schematically showing an exemplary light emitting device according to a second embodiment.
Figure 10B:
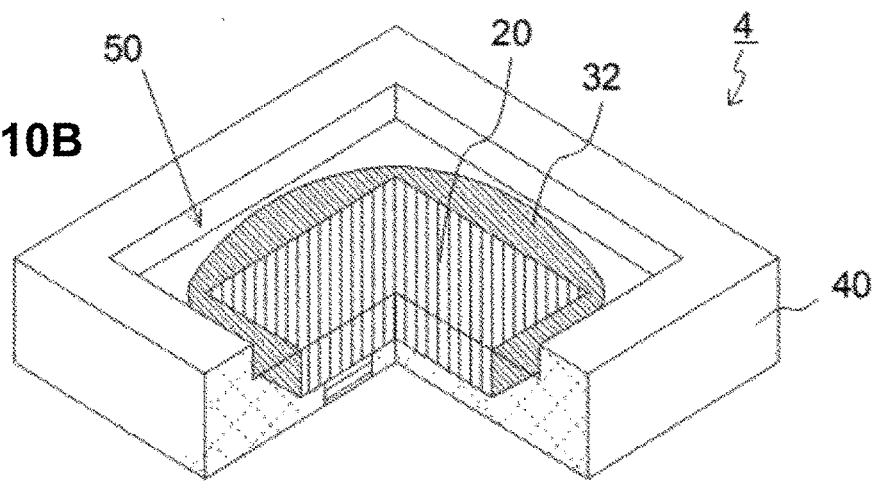
FIG. 10B is a partial cutaway view schematically showing the light emitting device according to the second embodiment.
Figure 10C:
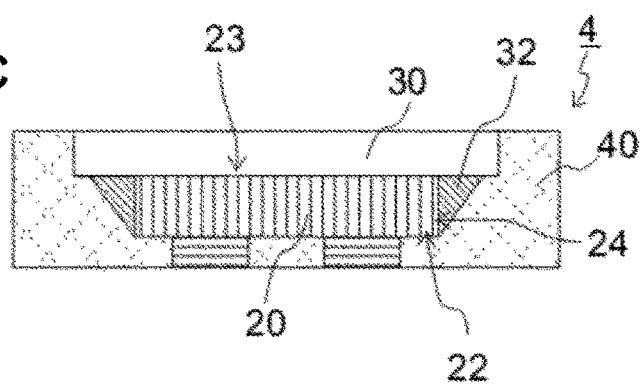
FIG. 10C is a cross-sectional view taken along line B-B in FIG. 10A.

FIGS. 10A to 10C show a light emitting device 4 according to a second embodiment. The light emitting device 4 includes a light emitting element 20, a first light-transmissive member 30 provided on the upper surface of the light emitting element 20, a second light-transmissive member 32 provided at a lateral surface 24 of the light emitting element 20, and a cover member 40 that covers the lateral surface 24 of the second light-transmissive member 32. The first light-transmissive member 30 functions as the light emitting surface of the light emitting device 4. The second embodiment is to the same as the first embodiment except that the second light-transmissive member 32 is provided at the lateral surface of the light emitting element.

With reference to FIGS. 11A to 11D and FIGS. 12A to 12D, a description will be given of a method of manufacturing the light emitting device according to the second embodiment. While the description will be given of the case where no sheet is used, obviously a sheet may be used.

Figure 11A:
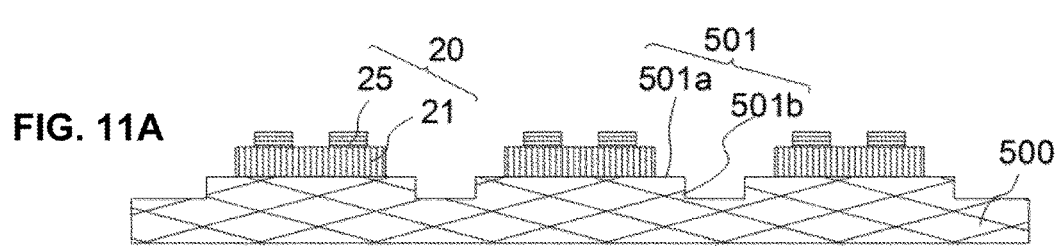
FIGS. 11A to 11D are schematic diagrams for describing a method of manufacturing the light emitting device according to the second embodiment.

Firstly, as shown in FIG. 11A, the light emitting element 20 is disposed on an upper surface 501a of each projected portion of a lower mold 500. In the second embodiment, the area of the upper surface 501a of each projected portion of the lower mold 500 is greater than the area of the light extracting surface of the light emitting element 20 arranged thereon. That is, the upper surface 501a of each projected portion must have an exposed upper surface where the light emitting element 20 is not placed. Then, the second light-transmissive member 32 is provided at the exposed upper surface 501a. When the second light-transmissive member 32 in a flowable liquid state is provided on the upper surface 501a of each projected portion, the second light-transmissive member 32 creeps up the lateral surface of the light emitting element 20 and covers at least a part of the lateral surface of the light emitting element. The second light-transmissive member 32 may cover substantially the entire lateral surface of the light emitting element. Preferably, the second light-transmissive member 32 is provided so as not to reach the electrode-formed surface of the light emitting element 20.

Figure 11B:
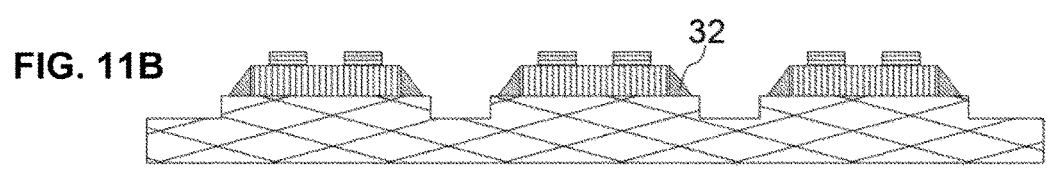

In this manner, the outer surface of the second light-transmissive member 32, which is formed so as to creep up the lateral surface of the light emitting element 20, is inclined for example as shown in FIG. 11B. The inclination angle may be about 30 degrees to 70 degrees relative to the upper surface 501a of the projected portion. The outer surface of the second light-transmissive member 32 may be straight or curved in a cross-sectional view. In this case, the curve may be concave or convex.

The second light-transmissive member 32 may cover the entire region where is in the upper surface 501a of the lower mold and the light emitting element 20 is not placed, or may partially cover such a region. In the case where the light emitting elements 20 are disposed on the upper surface of the lower mold with a sheet interposed therebetween, since the upper surface of each projected portion of the lower mold is covered by the sheet, the second light-transmissive member 32 is provided on the sheet on the upper surface of the projected portions.

The second light-transmissive member 32 is preferably not provided at the region except for the upper surface 502a of each projected portion of the lower mold. That is, the second light-transmissive member 32 is preferably not provided at a lateral surface 501b of each projected portion or the surface between the projected portions 501 (i.e., the bottom surface of the recessed portion).

Figure 11C:
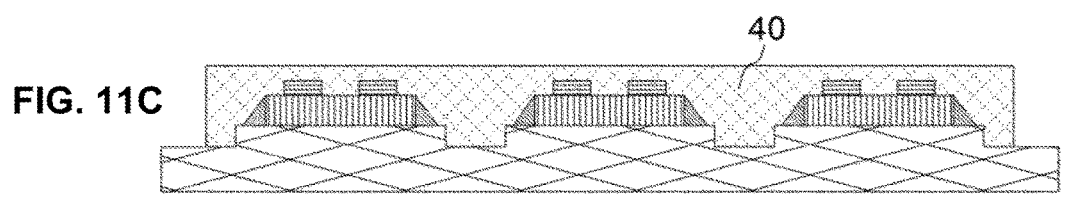
Figure 11D:
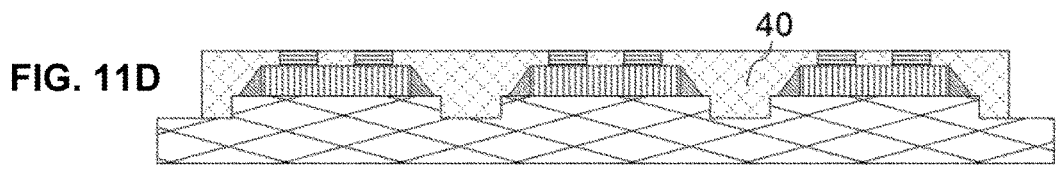

Thereafter, as shown in FIG. 11C, the cover member 40 is provided so as to embed the second light-transmissive member 32 provided at the lateral surface of each light emitting element 20, the light emitting elements 20, and the projected portions 501 of the lower mold. As shown in FIG. 11D, after the electrodes of the light emitting elements are exposed, the molded workpiece is bonded to a sheet S1 and removed from the lower mold 500. In this manner, the cover member 40 having the recessed portions on the light extracting surface side of the light emitting elements can be obtained.

Figure 12A:
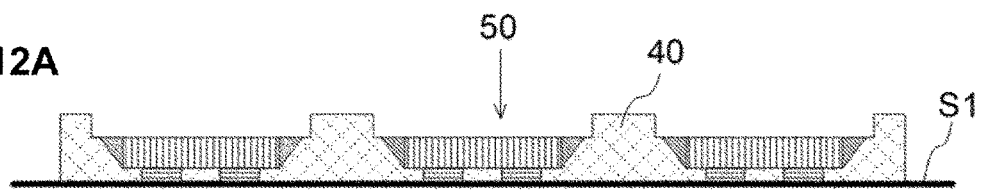
FIGS. 12A to 12D are schematic diagrams showing the method of manufacturing the light emitting device according to the second embodiment.
Figure 12B:
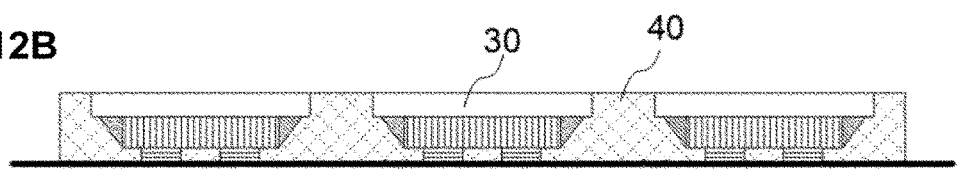
Figure 12C:
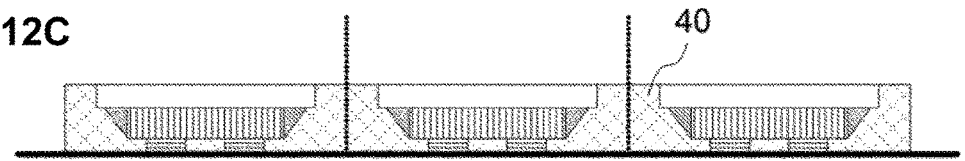
Figure 12D:

FIG. 12A exemplarily shows the state where the molded workpiece bonded to the sheet S1 is turned upside down. The bottom surface of each recessed portion 50 is structured by the light extracting surface of the light emitting element, the second light-transmissive member 32, and the cover member 40. FIG. 10B exemplarily shows the recessed portion 50 formed to have such a structure, and exemplarily shows one individual light emitting device from which the first light-transmissive member is omitted. The first light-transmissive member 30 provided in the recessed portion 50 receives light emitted from the light extracting surface 23 of the light emitting element and light emitted from the lateral surface of the light emitting element into the second light-transmissive member 32 to pass through the second light-transmissive member 32. In the case where the outer lateral surface of the second light-transmissive member 32 is a surface inclined toward the light emitting surface, the light from the light emitting element is reflected by the inclined surface as a reflective surface. Thus, the light extraction efficiency of the light emitting device in the light extracting surface direction can be improved. In the example shown in FIGS. 10A to 10C, the recessed portion of which sidewall is the cover member 40 is quadrangular as seen from above (i.e., the opening shape), and the outer circumference of the second light-transmissive member 32 (i.e., the outer circumference at the bottom surface of the recessed portion) is approximately circular.

As described above, by the opening shape of the recessed portion and the outer circumferential shape of the second light-transmissive member 32 being different in shape from each other, the wide light emitting area can be obtained. Further, by the opening shape of the recessed portion being the shape similar to the outer circumferential shape of the second light-transmissive member, e.g., approximately circular, uneven light emission can be reduced. Since the opening shape of the recessed portion is determined by the shape of each projected portion of the mold, the shape appropriate to the purpose or intended use can be arbitrarily selected. Further, adjustment of the shape of the second light-transmissive member 32, that is, the shape or dimension of the portion being in contact with the upper surface of the projected portion of the mold, or the area that covers the lateral surface of the light emitting element, can be attained by arbitrarily selected viscosity or amount of the material of the second light-transmissive member 32.

Third Embodiment

Figure 13A:
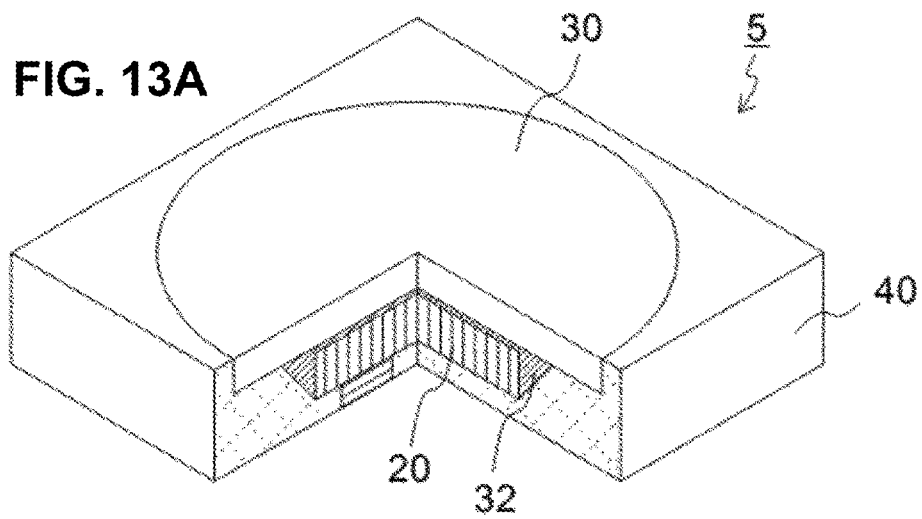
FIG. 13A is a perspective view schematically showing an exemplary light emitting device according to a third embodiment.
Figure 13B:
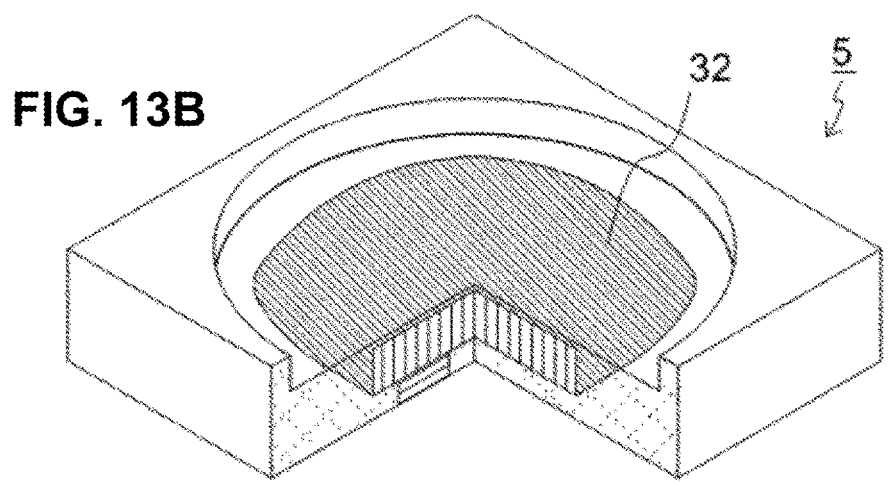
FIG. 13B is a partial cutaway view schematically showing the light emitting device according to the third embodiment.
Figure 13C:
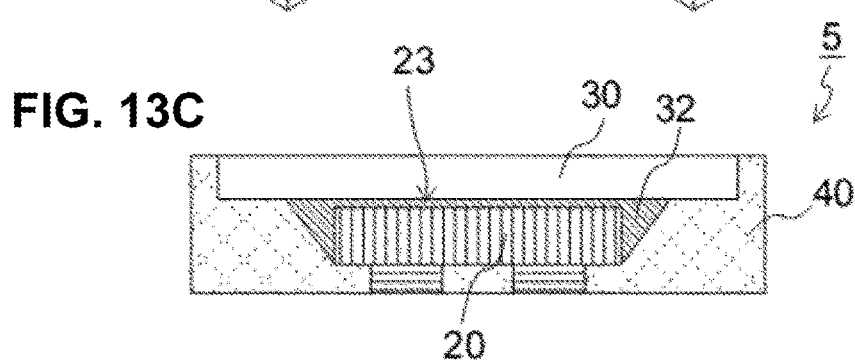
FIG. 13C is a cross-sectional view of the light emitting device according to the third embodiment.

FIGS. 13A to 13C show a light emitting device 5 according to a third embodiment. The light emitting device 5 includes a light emitting element 20, a first light-transmissive member 30 provided on the upper surface of the light emitting element 20, a second light-transmissive member 32 provided at the lateral surface of the light emitting element 20, and a cover member 40, which covers the lateral surface of the second light-transmissive member 32. The first light-transmissive member 30 functions as the light emitting surface of the light emitting device 5. The third embodiment is the same as the first embodiment except that the second light-transmissive member 32 provided at the lateral surface of the light emitting element is further provided at the light extracting surface 23 of the light emitting element, in addition to the lateral surface of the light emitting element.

With reference to FIGS. 14A to 14E and FIGS. 15A to 15D, a description will be given of a method of manufacturing the light emitting device according to the third embodiment. While the description will be given of the case where a sheet is used, obviously the sheet may not be used.

Firstly, as shown in FIG. 14A, the second light-transmissive members 32 are formed on the upper surface of a sheet S2. Here, the second light-transmissive members 32 in a liquid state before being cured is applied in shapes of separated islands. The positions where the second light-transmissive members 32 are formed are set so as to correspond to the positions of projected portions 601 of a mold 600 used in a later process. The shape of the second light-transmissive members 32 in the state before being cured may be circular, elliptical, square, rectangular and the like in a plan view.

Subsequently, as shown in FIG. 14B, the light emitting elements 20 are disposed on the second light-transmissive members 32 before being cured. Only by placing the light emitting elements on the second light-transmissive members, or by pressing the arranged light emitting elements, the second light-transmissive members creep up the lateral surfaces of the light emitting elements by surface tension, and the outer lateral surfaces of the second light-transmissive members 32 are downwardly widened. By being cured thereafter, the second light-transmissive members 32 being in contact with the lateral surfaces of the light emitting elements are formed.

In the present manufacturing method, the second light-transmissive members 32 are interposed between the upper surfaces of the projected portions (in the case where a sheet is used, the upper surface of the sheet) and the light emitting elements. That is, the second light-transmissive member 32 can also function as an adhesive agent between the sheet S2 and the light emitting elements. The thickness of the second light-transmissive members formed at these positions may be, for example, 2 μm to 30 μm, preferably 4 μm to 20 μm, and most preferably about 5 μm to 10 μm.

Subsequently, as shown in FIG. 14C, the sheet S2 bearing the light emitting elements 20 is disposed on the upper surface of the mold 600. The sheet S2 is disposed such that the light emitting element 20 and the second light-transmissive member 32 are entirely disposed within the upper surface of each projected portion 601 of the mold. The sheet S2 is subjected to vacuum suction by the through holes provided at the mold, whereby the sheet S2 deforms so as to conform to the uneven shape of the upper surface of the mold. Here, preferably each second light-transmissive member 32 is less likely to be deformed (i.e., widened) in accordance with the deformation of the sheet S2. For example, greater suction force may be set by increasing the number of through holes positioned immediately below the second light-transmissive members 32. This allows the portion of the sheet S2 where the second light-transmissive members 32 are not placed to preferentially deform (i.e., stretch).

Thereafter, as shown in FIG. 14D, the cover member 40 is provided so as to embed the second light-transmissive member 32 provided at the lateral surface of each light emitting element 20, the light emitting elements 20, and the projected portions 601 of the lower mold. As shown in FIG. 14E, after the electrodes of the light emitting elements are exposed, the molded workpiece is bonded to a sheet S1 and removed from the lower mold 600. In this manner, the cover member 40 having the recessed portions on the light extracting surface side of the light emitting elements can be obtained.

FIG. 15A exemplary shows the state where the molded workpiece bonded to the sheet S1 is turned upside down.

The bottom surface of each recessed portion 50 is structured by the second light-transmissive member 32 that covers the light extracting surface of the light emitting element, and the cover member 40. FIG. 15B exemplarily shows the recessed portion 50 formed in such a structure, and exemplarily shows one individual light emitting device from which the first light-transmissive member is omitted. The second light-transmissive member 32 is formed to have a greater area than that of the light extracting surface of the light emitting element. The first light-transmissive member 30 provided in the recessed portion 50 indirectly receives light emitted from the light extracting surface and the lateral surface of the light emitting element via the second light-transmissive member 32. In the case where the outer lateral surface of the second light-transmissive member 32 is a surface outwardly inclined toward the light emitting surface, the light from the light emitting element is reflected by the inclined surface. Thus, the light extraction efficiency of the light emitting device in the light extracting surface direction can be improved. Further, since the light extracting surface of the light emitting element does not structure the bottom surface of the recessed portion, the light emitting element can be protected from any damage when being arranged on the projected portion, when the cover member 40 is molded, or when the light emitting element is removed from the mold.

Figure 16A:
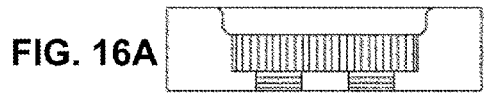
FIGS. 16A to 16F are schematic cross-sectional views exemplarily showing variations of the light emitting device according to the first to third embodiments.
Figure 16D:
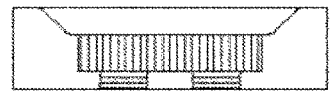
Figure 16B:
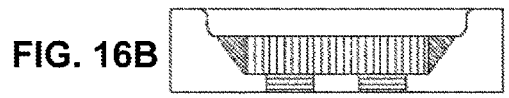
Figure 16E:
Figure 16C:
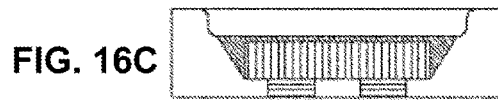
Figure 16F:
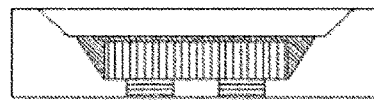

FIGS. 16A to 16F exemplarily show variations of the light emitting device according to the embodiments described above. FIGS. 16A and 16D each show a light emitting device in which the cover member is in contact with the lateral surface of the light emitting element as described in the first embodiment. In FIG. 16A, the lower end and upper end of the lateral surface of the first light-transmissive member are curved surfaces. In FIG. 16D, the lateral surface of the first light-transmissive member is inclined relative to the upper surface of the light emitting element. FIGS. 16B and 16E each show a light emitting device in which the second light-transmissive member covers the lateral surface of the light emitting element and the cover member is provided on the outer side of the second light-transmissive member as described in the second embodiment. In FIG. 16B, the lower end and upper end of the lateral surface of the light-transmissive member are curved surfaces. In FIG. 16E, the lateral surface of the first light-transmissive member is inclined relative to the upper surface of the light emitting element. The inclination angle of the lateral surface of the first light-transmissive member and that of the lateral surface of the second light-transmissive member may be identical to or different from each other. FIGS. 16C and 16F each show a light emitting device in which the second light-transmissive member covers the upper surface and the lateral surface of the light emitting element and the cover member is provided on the outer side of the second light-transmissive member as described in the third embodiment. Further, in FIG. 16C, the upper and lower ends of the lateral surface of the first light-transmissive member are curved surfaces. In FIG. 16F, the lateral surface of the first light-transmissive member is inclined relative to the upper surface of the light emitting element. The inclination angle of the lateral surface of the first light-transmissive member and that of the lateral surface of the second light-transmissive member may be identical to or different from each other. FIGS. 16A, 16B and 16C each show a light emitting device in which the cover member is formed by being arranged on the upper surface of the lower mold via a sheet, and the upper end and lower end of the lateral surface of the recessed portion formed in the cover member are rounded conforming to the shape of the deformed sheet. FIGS. 16D, 16E and 16F each show a light emitting device in which the lateral surface of the recessed portion of the cover member is inclined. This is attained by an inclined lateral surface of the projected portion of the lower mold.

In the following, a description will be given of the materials and the like suitable for the constituent members of the light emitting device according to the embodiments.

(Light Emitting Element)

The light emitting element may be, for example, a semiconductor light emitting element such as a light emitting diode. The light emitting element may be a light emitting element that is capable of emitting visible light such as blue, green, or red color. The semiconductor light emitting element may include a light-transmissive substrate and a semiconductor stacked-layer body formed on the light-transmissive substrate. Further, the semiconductor stacked-layer body has an electrode-formed surface where electrodes are provided, on the side opposite to the light-transmissive substrate (on the opposite surface). The light-transmissive substrate of the semiconductor stacked-layer body serves as the light extracting surface.

(Semiconductor Stacked-Layer Body)

The semiconductor stacked-layer body includes a plurality of semiconductor layers. An exemplary semiconductor stacked-layer body may include three types of semiconductor layers, namely, a first conduction type semiconductor layer (e.g., an n-type semiconductor layer), a light emission layer (i.e., an active layer), and a second conduction type semiconductor layer (e.g., a p-type semiconductor layer). The semiconductor layer capable of emitting ultraviolet light or blue to green-color visible light may be made of a semiconductor material such as a Group III-V compound semiconductor, a Group II-VI compound semiconductor and the like. Specifically, a nitride-based semiconductor material such as $In_xAl_yGa_{1-x-y}N$ ($0 \leq X$, $0 \leq Y$, $X+Y \leq 1$) (e.g., InN, AlN, GaN, InGaN, AlGaN, InGaAlN and the like) may be used. As a semiconductor stacked-layer body capable of emitting red-color light, GaAs, GaAlAs, GaP, InGaAs, InGaAsP and the like may be used.

(Light-Transmissive Substrate)

The light-transmissive substrate of the light emitting element may be, for example with the above-noted nitride-based semiconductor material, a light-transmissive insulating material such as sapphire ($Al_2O_3$) and spinel ($MgAl_2O_4$), or a semiconductor material that transmits light from the semiconductor stacked-layer body (e.g., a nitride-based semiconductor material) may be used. For the materials of GaAs based semiconductor, GaAlAs, InGaAs and the like can be applied. The light transmissivity as used herein refers to the capacity of transmitting about 60%, 65%, 70%, 80% or greater of light received from the light emitting element.

(Electrodes)

A pair of electrodes of the light emitting elements is disposed on the identical surface of the semiconductor layer. The pair of electrodes may have a single-layer structure or a stacked-layer structure, so long as the electrodes are respectively capable of ohmically connecting to the first conduction type semiconductor layer and the second conduction type semiconductor layer, such that the current-voltage relationship is linear or approximately linear. Such electrodes can be formed with any material and structure known in the art by an arbitrary thickness. For example, the thickness is preferably ten-odd μm to 300 μm. The electrodes may be made of an electrically good conductive material, and for example, metal such as Cu, Au, Ag, and AuSn are suitable.

(First Light-Transmissive Member)

With respect to the first light-transmissive member, as a light-transmissive material, a light-transmissive resin, glass and the like may be used. In particular, a light-transmissive resin is preferable, and a thermosetting resin such as silicone resin, silicone modified resin, epoxy resin, and phenol resin, and a thermoplastic resin such as polycarbonate resin, acrylic resin, methylpentene resin, and polynorbornene resin may be used. In particular, silicone resin that exhibits good light resistance and heat resistance is preferable.

The first light-transmissive member may contain a fluorescent material in addition to the light-transmissive material. For the fluorescent material, the one capable of being excited by light from the light emitting element is employed. For example, a fluorescent material capable of being excited by a blue-color light emitting element or a ultraviolet light emitting element may be: a cerium-activated yttrium-aluminum-garnet-based fluorescent material (Ce:YAG); a cerium-activated lutetium-aluminum-garnet-based fluorescent material (Ce:LAG); an europium- and/or chromium-activated nitrogen-containing calcium aluminosilicate fluorescent material ($CaO$—$Al_2O_3$—$SiO_2$); an europium-activated silicate-based fluorescent material (($Sr,Ba)_2SiO_4$); a nitride-based fluorescent material such as a β-sialon fluorescent material, a CASN-based fluorescent material, and a SCASN-based fluorescent material; a KSF-based fluorescent material ($K_2SiF_6$:Mn); a sulfide-based fluorescent material, a quantum dot fluorescent material and the like. Combining the fluorescent materials and a blue-color light emitting element or a ultraviolet light emitting element, light emitting devices that emit light of various colors can be manufactured (e.g., a white-color-base light emitting device).

Further, the first light-transmissive member may contain various types of filler, in order to adjust viscosity or the like.

(Second Light-Transmissive Member)

The second light-transmissive member can be made of a light-transmissive material such as a light-transmissive resin and glass. The light-transmissive resin is particularly preferably a thermosetting light-transmissive resin such as silicone resin, silicone modified resin, epoxy resin, and phenol resin. Since the second light-transmissive member is in contact with the lateral surface of the light emitting element, the second light-transmissive member is likely to be affected by heat generated by the light emitting element when the light emitting element emits light. The thermosetting resin exhibits excellent heat resistance, and therefore is suitable for the second light-transmissive member. The second light-transmissive member preferably exhibits high light transmissivity. Therefore, preferably, any additive that reflects, absorbs or scatters light is normally not added to the second light-transmissive member. However, in some cases, an additive is preferably added to the second light-transmissive member in order to provide a desired characteristic. For example, in order to adjust the refractive index of the second light-transmissive member, or to adjust the viscosity of the second light-transmissive member before being cured, various types of filler may be added.

(Cover Member)

The cover member covers the lateral surface of the first light-transmissive member. Further, the cover member preferably covers also the lateral surface of the light emitting element. In the case where the second light-transmissive member is provided on the lateral surface of the light emitting element, the cover member is provided on the further outer side thereof.

The cover member is made of a material that has predetermined thermal expansion coefficient relationship with the light-transmissive member and the light emitting element. That is, the material of the cover member is selected such that the difference in the thermal expansion coefficient $\Delta T_{40}$ between the cover member and the light emitting element is smaller than the difference in the thermal expansion coefficient $\Delta T_{30}$ between the light-transmissive member and the light emitting element. For example, when the light emitting element includes the light-transmissive substrate of sapphire and the semiconductor stacked-layer body made of a GaN-based semiconductor, the thermal expansion coefficient of the light emitting element is about 5 to $7\times10^{-6}$/K. Also, when the light-transmissive member is made of silicone resin, the thermal expansion coefficient of the light-transmissive member is 2 to $3\times10^{-5}$/K. Hence, when the cover member is made of a material of which thermal expansion coefficient is smaller than that of silicone resin, $\Delta T_{40} < \Delta T_{30}$ is established.

In the case where a resin material is used for the cover member, generally, the thermal expansion coefficient is on the order of $10^{-5}$/K, which is one digit greater than the thermal expansion coefficient of a general light emitting element. However, addition of filler or the like to the resin material can reduce the thermal expansion coefficient of the resin material. For example, addition of filler such as silica to the silicone resin can reduce the thermal expansion coefficient, as compared to the silicone resin without the filler.

The resin material as applicable to a material of the cover member may be particularly preferably a thermosetting light-transmissive resin such as silicone resin, silicone modified resin, epoxy resin, and phenol resin.

The cover member may be made of a light-reflective resin. The light-reflective resin means a resin material that reflects at least 70% of light received from the light emitting element. Since the light reaching the cover member is reflected and directed toward the light emitting surface of the light emitting device, the light extraction efficiency of the light emitting device can be improved.

The light-reflective resin may be, for example, a light-transmissive resin in which a light-reflective substance is dispersed. Suitably, the light-reflective substance may be, for example, titanium oxide, silicon dioxide, zirconium dioxide, potassium titanate, aluminum oxide, aluminum nitride, boron nitride, mullite and the like. The light-reflective substance may be granular, fibrous, or thin place shaped. In particular, a fibrous light-reflective substance is preferable because it provides also the effect of reducing the thermal expansion coefficient of the cover member.

In the foregoing, while the description has been exemplarily given of several embodiments according to the present invention, obviously the present invention is not limited to the embodiments described above, and any variations are included unless they deviate from the spirit of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device, the method comprising:
   providing a light emitting element that has an electrode-formed surface, a light extracting surface opposite to the electrode-formed surface in a light emitting element height direction, and a light emitting element lateral surface provided between the electrode-formed surface and the light extracting surface;

providing a lower mold that has an upper surface and a projected portion projecting in a lower mold height direction from the upper surface, the projected portion having a bottom portion which is provided on the upper surface and having a projected portion upper surface opposite to the bottom portion in the lower mold height direction, the projected portion having a projected portion lateral surface provided between the bottom portion and the projected portion upper surface;

arranging the light emitting element on the projected portion of the lower mold such that the light extracting surface contacts the projected portion upper surface;

covering the upper surface, the projected portion lateral surface and the light emitting element lateral surface with a cover member after arranging the light emitting element on the projected portion of the lower mold such that the light extracting surface contacts the projected portion upper surface;

removing the lower mold to provide a recessed portion on the light extracting surface surrounded by a sidewall made of the cover member; and providing a first light-transmissive member in the recessed portion.

2. The method according to claim 1, further comprising:
providing a second light-transmissive member to cover the light emitting element lateral surface after arranging the light emitting element on the projected portion of the lower mold.

3. The method according to claim 1, further comprising:
providing a second light-transmissive member on the projected portion upper surface before arranging the light emitting element on the projected portion of the lower mold.

4. The method according to claim 1, wherein the light emitting element is arranged on the projected portion of the lower mold via a sheet, the light extracting surface contacting the projected portion upper surface via the sheet.

5. The method according to claim 4, wherein the lower mold holds the sheet by suctioning the sheet.

6. The method according to claim 4,
wherein the light emitting element is arranged on the sheet, and
wherein the sheet on which the light emitting element is arranged is placed on the lower mold.

7. The method according to claim 1, wherein the first light-transmissive member includes a wavelength conversion member.

8. The method according to claim 1, wherein a plurality of the light emitting elements are disposed on the projected portion.

* * * * *